United States Patent [19]

Aoki

[11] Patent Number: 5,675,501
[45] Date of Patent: Oct. 7, 1997

[54] METHOD OF DESIGNING SEMICONDUCTOR INTEGRATED CIRCUIT APPARATUS HAVING NO DEAD SPACE

[75] Inventor: Sachiko Aoki, Yokohama, Japan

[73] Assignee: Kabushiki Kaisha Toshiba, Kawasaki, Japan

[21] Appl. No.: 404,452

[22] Filed: Mar. 15, 1995

[30] Foreign Application Priority Data

Mar. 15, 1994 [JP] Japan .................. 6-044328

[51] Int. Cl.$^6$ .................................. H01L 23/50
[52] U.S. Cl. ..................... 364/490; 364/491
[58] Field of Search ................ 364/488, 490, 364/491, 489; 365/104, 51; 257/206, 207

[56] References Cited

U.S. PATENT DOCUMENTS

| | | | |
|---|---|---|---|
| 4,695,978 | 9/1987 | Itakura | 364/51 |
| 4,910,680 | 3/1990 | Hiwatashi | 364/491 |
| 5,212,653 | 5/1993 | Takaka | 364/491 |
| 5,392,233 | 2/1995 | Iwase | 365/104 |
| 5,401,988 | 3/1995 | Kudou et al. | 257/207 |
| 5,416,720 | 5/1995 | Fukui | 364/489 |

OTHER PUBLICATIONS

Compacting Dead Space in Partitioning Methods for Random Cells Placements, IEEE 1991.
CLEO: a CMOS Layout Generator, IEEE 1989.
A Floorplanning Algorithm Using Rectangular Voronoi Diagram and Force-Directed Block Shaping, IEEE 1991.
IEEE 1992 Custom Integrated Circuits Conference, pp. 11.1.1–11.1.4, 1992, Stan Chow, et al., "The Layout Synthesizer: An Automatic Block Generation System".
ICCAD, pp. 340–343, 1989, Antun Domic, et al., "CLEO: a CMOS Layout Generator".

Primary Examiner—Kevin J. Teska
Assistant Examiner—Dan Fiul
Attorney, Agent, or Firm—Oblon, Spivak, McClelland, Maier & Neustadt, P.C.

[57] ABSTRACT

A method of designing a semiconductor integrated circuit apparatus vice comprises: a placement step of generating row information indicating a transistor row in which transistors required for the configuration of a transistor row to be designed are placed so that wiring length is as short as possible on the basis of net connection information of transistors, size information of various transistors constituting the net, and ideal module size information which provides constraint relating to sizes in X-direction and sizes in Y-direction perpendicular to the X-direction of the transistor row in which the various transistors are arranged in the X-direction; a row size determination step of generating, on the basis of the row information, row size information indicating sizes in the X-direction and the Y-direction of the transistor row that the row information indicates; and a parallel arrangement step of carrying out parallel arrangement of transistors constituting the transistor row so that the transistor row that the row information indicates falls within sizes in X-direction and Y-direction that the row size information indicates.

8 Claims, 12 Drawing Sheets

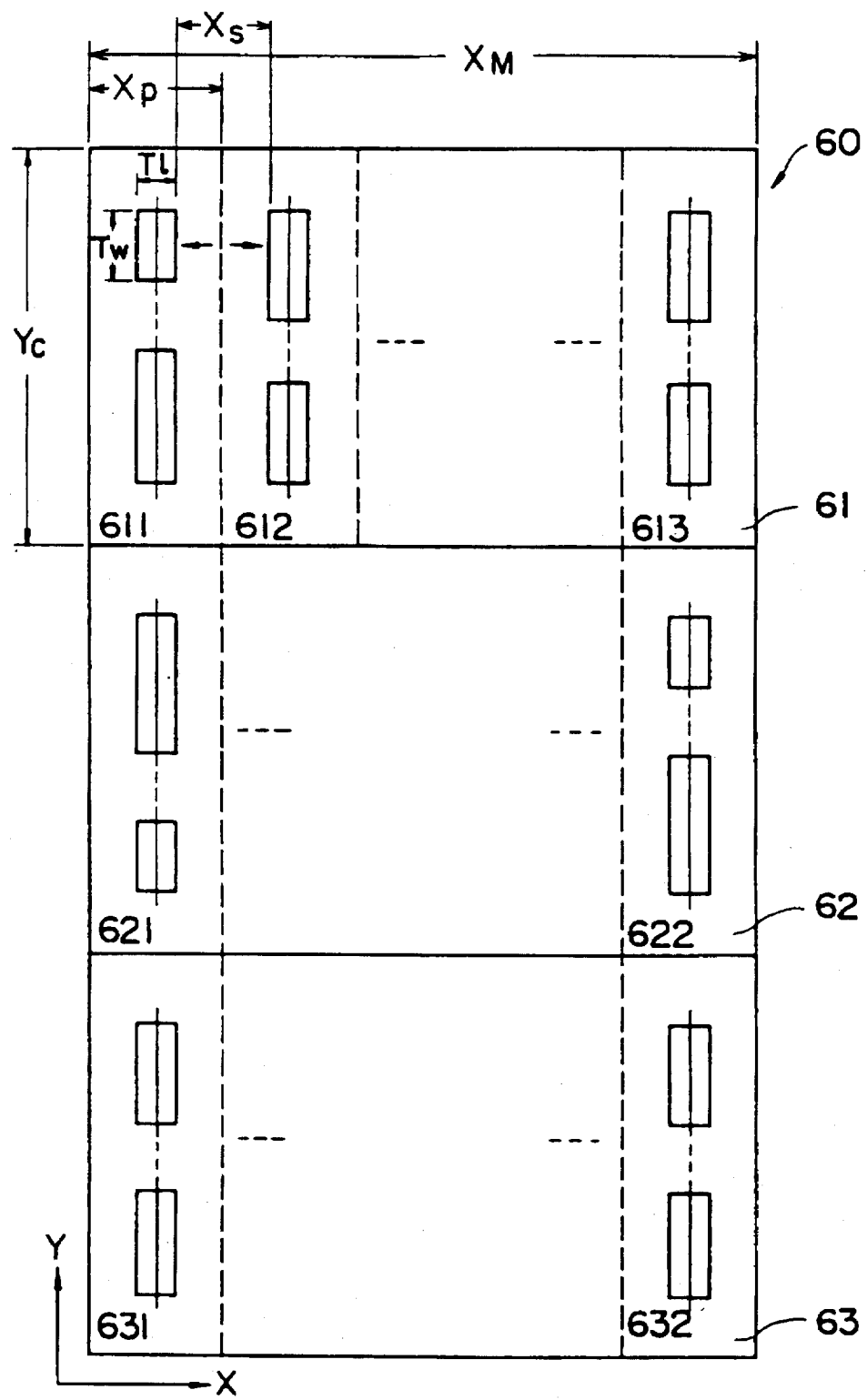
F I G. 2

CALCULATION OF SIZES
IN X-DIRECTION AND
SIZES IN Y-DIRECTION
EVERY ROWS
(S101 - S102)

DETERMINATION OF SIZE
$X_M$ IN X-DIRECTION OF
MODULE, DETERMINATION
OF SIZES $Y_{C1}$-$Y_{C3}$ EVERY
ROWS
(S103 - S104)

DETERMINATION OF HEIGHT OF ROWS EVERY ROWS

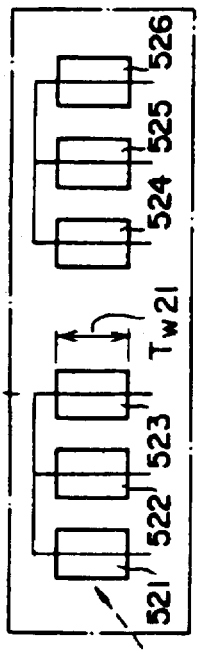
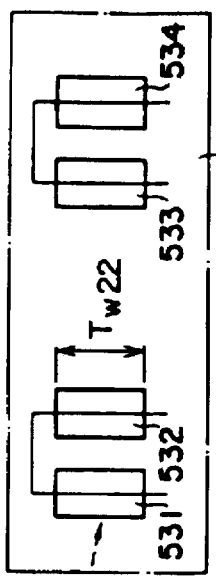
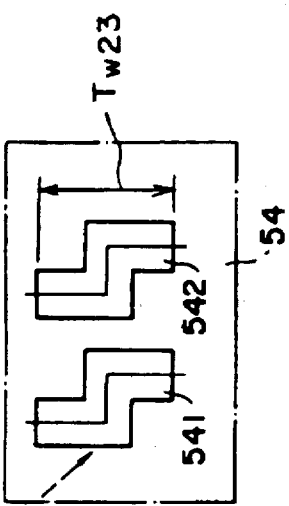
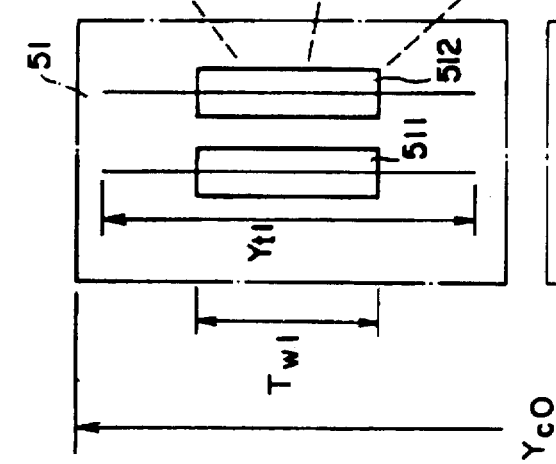

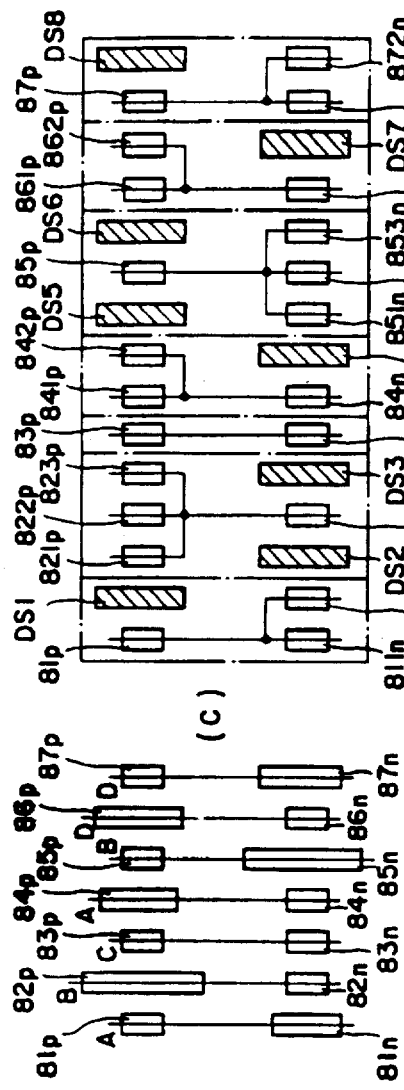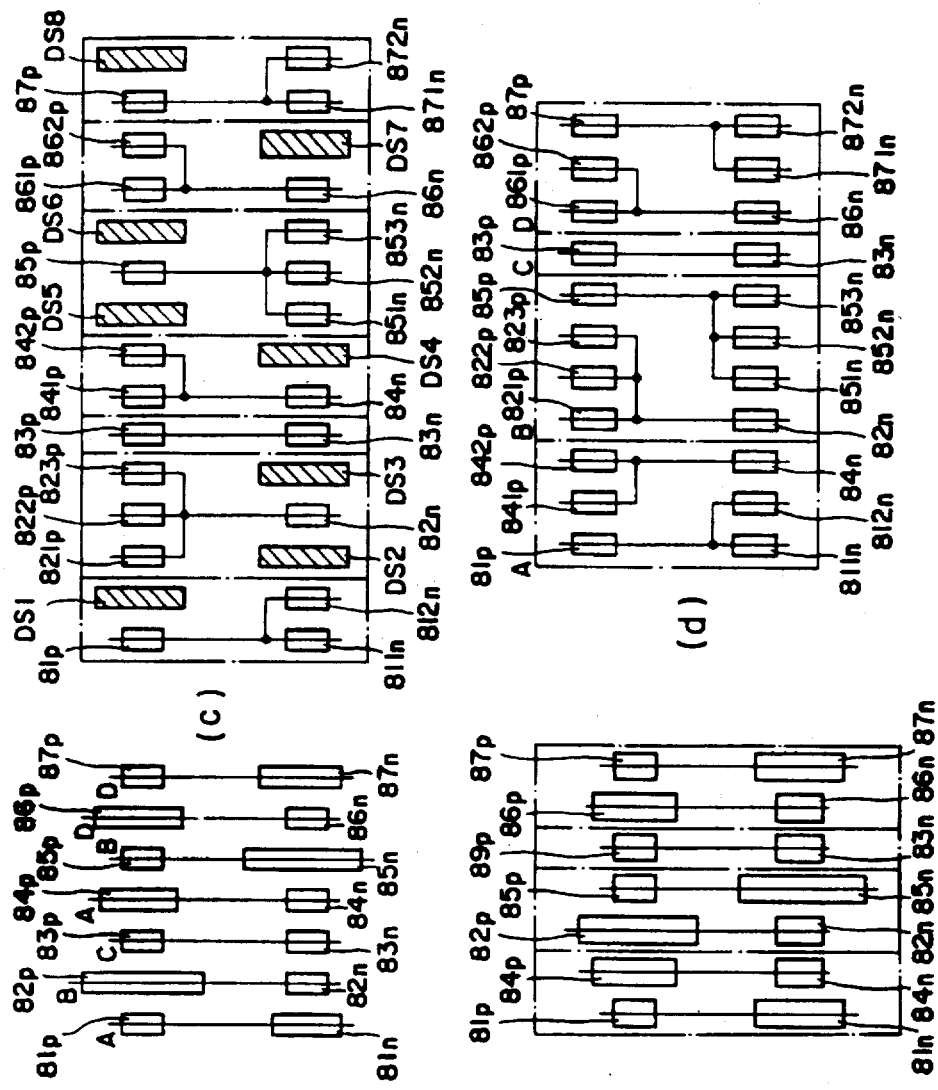

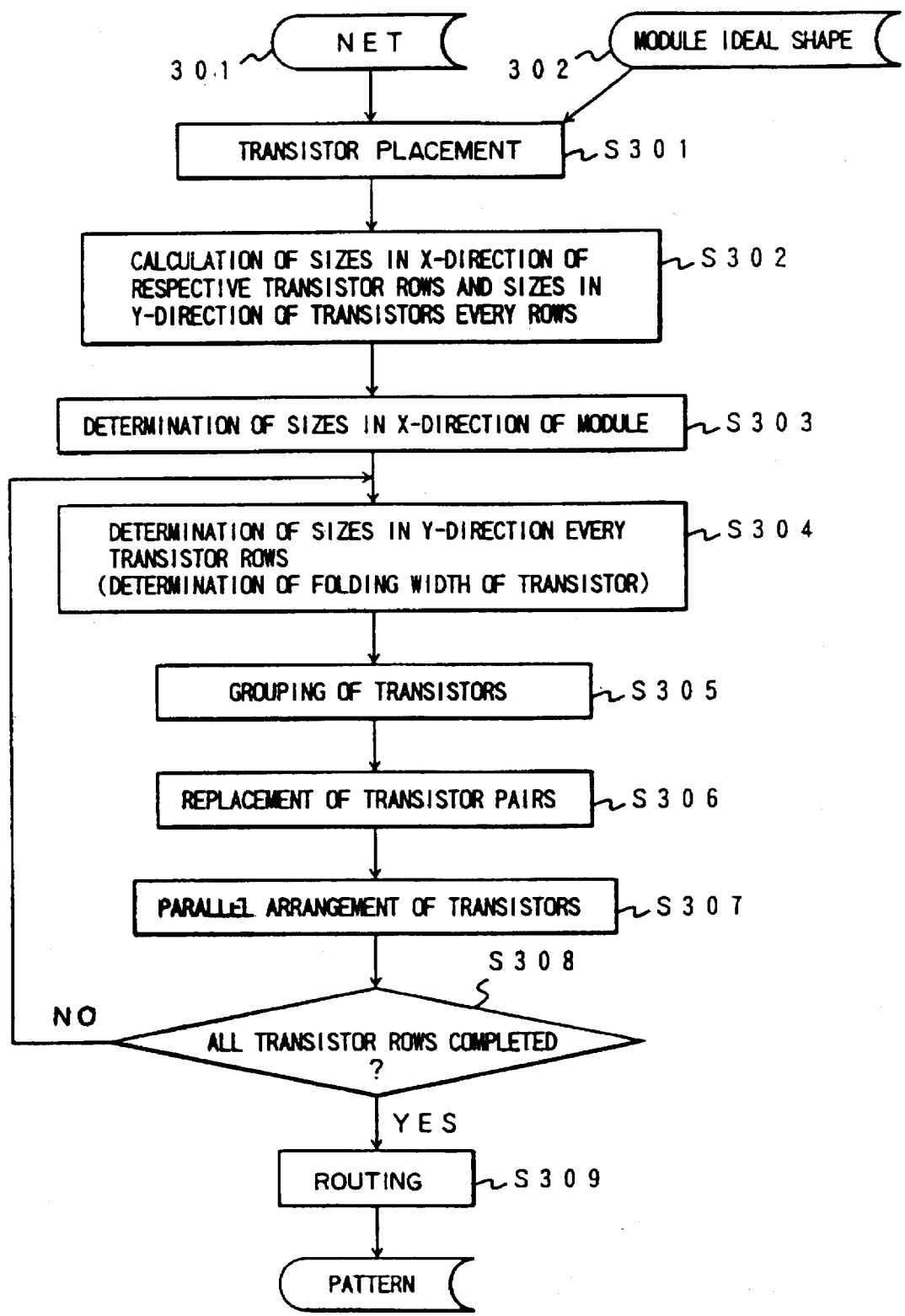
F I G. 10

| ROW | ORDINARY MODULE WIDTH | ORDINARY ROW HEIGHT | CONVENTIONAL PARALLEL ARRANGEMENT MODULE WIDTH | CONVENTIONAL PARALLEL ARRANGEMENT ROW HEIGHT | PARALLEL ARRANGEMENT MODULE WIDTH OF THIS INVENTION | PARALLEL ARRANGEMENT ROW HEIGHT OF THIS INVENTION |
|---|---|---|---|---|---|---|
| 29 | 3538.0 | 312.0 | 3658.0 | 81.0 | 4348.0 | 49.0 |
| 28 | 4234.0 | 312.0 | 4309.0 | 81.0 | 5089.0 | 49.0 |
| 27 | 4147.0 | 312.0 | 4192.0 | 81.0 | 4777.0 | 49.0 |
| 26 | 4031.0 | 312.0 | 4046.0 | 81.0 | 4376.0 | 49.0 |
| 25 | 4292.0 | 312.0 | 4397.0 | 81.0 | 5057.0 | 49.0 |
| 24 | 3973.0 | 312.0 | 4048.0 | 81.0 | 4566.0 | 49.0 |
| 23 | 4002.0 | 312.0 | 4062.0 | 81.0 | 4471.0 | 49.0 |
| 22 | 4147.0 | 312.0 | 4222.0 | 81.0 | 4840.0 | 49.0 |
| 21 | 4176.0 | 312.0 | 4297.0 | 81.0 | 5452.0 | 49.0 |
| 20 | 4147.0 | 312.0 | 4357.0 | 81.0 | 5182.0 | 49.0 |
| 19 | 3712.0 | 312.0 | 3877.0 | 81.0 | 5226.0 | 49.0 |
| 18 | 3509.0 | 312.0 | 3539.0 | 81.0 | 4394.0 | 49.0 |
| 17 | 3683.0 | 312.0 | 3683.0 | 81.0 | 3998.0 | 49.0 |
| 16 | 3799.0 | 312.0 | 3844.0 | 81.0 | 4312.0 | 49.0 |
| 15 | 4002.0 | 312.0 | 4077.0 | 81.0 | 4788.0 | 49.0 |
| 14 | 3973.0 | 312.0 | 4078.0 | 81.0 | 4678.0 | 49.0 |
| 13 | 4089.0 | 312.0 | 4254.0 | 81.0 | 4869.0 | 49.0 |
| 12 | 3567.0 | 312.0 | 3972.0 | 81.0 | 5022.0 | 49.0 |
| 11 | 3886.0 | 312.0 | 4066.0 | 81.0 | 4546.0 | 49.0 |
| 10 | 3886.0 | 312.0 | 4036.0 | 81.0 | 4501.0 | 49.0 |
| 9 | 3857.0 | 312.0 | 4052.0 | 81.0 | 4892.0 | 49.0 |
| 8 | 3857.0 | 312.0 | 3992.0 | 81.0 | 4412.0 | 49.0 |
| 7 | 4147.0 | 312.0 | 4193.0 | 81.0 | 4643.0 | 49.0 |
| 6 | 4060.0 | 312.0 | 4227.0 | 81.0 | 4947.0 | 49.0 |
| 5 | 3973.0 | 312.0 | 4093.0 | 81.0 | 4468.0 | 49.0 |
| 4 | 4205.0 | 312.0 | 4434.0 | 81.0 | 5604.0 | 49.0 |
| 3 | 3567.0 | 312.0 | 3837.0 | 81.0 | 5052.0 | 49.0 |
| 2 | 3625.0 | 312.0 | 3925.0 | 81.0 | 5020.0 | 49.0 |
| 1 | 4060.0 | 312.0 | 4555.0 | 81.0 | 6085.0 | 49.0 |
| 0 | 3625.0 | 312.0 | 3730.0 | 81.0 | 4191.0 | 49.0 |
| TOTAL | (A) 4292.0 (MAX. VALUE) | 9360.0 (TOTAL VALUE) | (B) 4555.0 (MAX. VALUE) | 2430.0 (TOTAL VALUE) | (C) 6085.0 (MAX. VALUE) | 1470.0 (TOTAL VALUE) |

(UNIT : $\mu$m)

FIG. 11

(UNIT: μm)

| TYPE | MAX. VALUE OF LENGTH IN MODULE WIDTH DIRECTION | SUM OF LENGTHS IN HEIGHT DIRECTION IN ROWS | AREA (mm$^2$) |
|---|---|---|---|
| (A) normal | 4292.0 | 9360.0 | 40173.1 |
| (B) fold | 4555.0 | 2430.0 | 11068.6 |
| (C) new | 6085.0 | 1470.0 | 8945.0 |

FIG. 12

METHOD OF DESIGNING SEMICONDUCTOR INTEGRATED CIRCUIT APPARATUS HAVING NO DEAD SPACE

BACKGROUND OF THE INVENTION

The present invention relates to a method of designing a semiconductor integrated logic circuit apparatus, and more practically to a designing method at the transistor level.

Hitherto, in the design at the transistor level, pattern designing by handwriting was mainly conducted. In the layout design by such handwriting pattern, shapes of transistors are modified in correspondence with shapes to be subjected to layout, and to modify shapes of respective components (elements) constituting a pattern to be subjected to layout, its deformable possibility and positional relationship, etc. as well.

On the other hand, in the case of automatically designing modules constituting a semiconductor chip by using Computer Aided Design (CAD) System, even when transistor height constituting the module are different, since layout was carried out as it was, there would be unevenness in widths of individual transistor rows constituting a portion of the module, resulting in dead spaces at the outside of the end portions of transistors of which entire width is short even with respect to the same row. The detail thereof will now be described in more practical manner with reference to FIG. 1.

FIG. 1 is an explanatory view showing concept of conventional pattern design processing of transistor, wherein FIG. 1(a) shows correspondence relationship between pattern symbols and circuit symbols, FIG. 1(b) shows an example of transistor row arranged at a certain module, and FIG. 1(c) shows the state where conventional parallel arrangement was carried out.

Initially, in FIG. 1(a), reference symbol G indicates gate, reference symbol S indicates source, and reference symbol D indicates drain. As the circuit, pattern of transistors having configuration shown on the right side of FIG. 1(a) is arranged as transistor row as shown in FIG. 1(b), and module is constituted so as to include a large number of transistor rows. In FIG. 1(b), reference numerals a01, a02, . . . , a0i are p-channel transistors constituting a half of one transistor row, and reference numerals b01, b02, . . . , boi are n-channel transistors constituting the other (remaining) half of the same transistor row. The circumstances where dead spaces DS are formed by sizes and layout of transistors with respect to transistor row as a portion of the module will now be described.

Length in module width direction (hereinafter refereed to as X-direction) of the transistor row is $X_M$, and width in width direction (hereinafter refereed to as Y-direction) of the transistor row is Yc. As previously described, since one transistor row is such that columns each comprised of a pair of transistors including p-channel and n-channel transistors are arranged in row direction, and widths in Y-direction of spaces for p-channel and n-channel transistors are respectively Yt. The area of dotted lines between these spaces of widths Yt and Yt is dead space DS. Moreover, also in individual elements, with respect to respective transistor row of the p-channel side and the n-channel side, dead spaces DS respectively would take place in dependency upon differences of length as compared to the longest transistor. In FIG. 1(b), reference numeral T1 is width in X-direction of transistor and Xs is clearance (spacing) between transistors adjacent to each other. Here, transistor length is defined as length in length direction (i.e., X-direction) of transistor in pattern symbol, and transistor width is defined as length in width direction (Y-direction) of transistor in pattern symbol. Dead spaces DS of respective element units are areas of slanting lines encompassed by single dotted chain lines in FIG. 1(b).

There are instances where parallel arrangement of transistors may be carried out in order to eliminate such dead spaces DS. "Parallel arrangement" referred to in this specification is to divide transistor into a plurality of transistor sections, or fold it so that particularly sizes in Y-direction of transistors constituting transistor row are in correspondence with each other. However, when such parallel arrangement is carried out, size in X-direction of the transistor row changes. For this reason, dead spaces would newly take place. FIG. 1(c) shows the state thereof. In FIG. 1(c), reference symbols c01, c02, . . . denote p-channel transistors constituting one half of one row, reference symbols d01, d02, . . . denote n-channel transistors constituting the other half of one row, wherein p-channel transistors c021–c023, n-channel transistors d031, d032 and p-channel transistors c041–c043 are obtained as the result of implementation of parallel arrangement. As the result of the fact that such division has been carried out, dead spaces DS are formed in n-channel transistor arrangement area opposite to p-channel transistor c021, n-channel transistor arrangement area opposite to p-channel transistor c023, p-channel transistor arrangement area opposite to n-channel transistor d032, and n-channel transistor arrangement area opposite to p-channel transistor c041, and n-channel transistor arrangement area opposite to p-channel transistor c043.

In the case where dead spaces as described above take place, pattern designer has nothing to do but conduct studying so as to eliminate such spaces. In such a case, working efficiency would be inevitably lowered.

As stated above, with the conventional method of designing semiconductor integrated circuit apparatus, there is no effective measure for eliminating dead spaces DS occurring in X-direction and Y-direction of transistors, thus also disadvantageously failing to conduct automation.

In order to allow the above-described dead spaces to be as minimum as possible, there is proposed "CLEO: a CMOS Layout Generator" disclosed at pp. 340 to 343 of International Conference 1989 on Computer Aided Design— ICCAD— of Institute of Electrical and Electronics Engineers—IEEE.

This CLEO determines module width and heights of respective rows to study, on the basis of heights of rows, a row on which a transistor of a desired configuration can be arranged. In this study, arrangement relationship of transistors is modified (changed) in correspondence with the module width and heights of respective rows which have been determined, and parallel arrangement of transistors arranged at specific portions is carried out as occasion demands.

However, in accordance with the prior art as described above, since arrangement relationship of transistors is changed and/or parallel arrangement of elements is carried out in correspondence with the determined shape of row (module width and heights of rows), the final location of transistors and primary location of transistors may differ to much degree. This is not only preferable from a viewpoint of circuit design, but also there may also result increase in quantity of wiring. Thus, these were instances where such a scheme is not preferable also from a viewpoint of entire space saving.

SUMMARY OF THE INVENTION

The present invention has been made in view of the problems that the prior art has, and contemplates determining optimum transistor row heights every transistor rows to carry out parallel arrangement (division/folding) of transistors having transistor width greater than the determined optimum transistor row height, thus to realize automatic layout of transistors of different sizes without dead space.

In more practical sense, an object of this invention is provide a method of designing a semiconductor integrated circuit apparatus which can eliminate dead space occurring resulting from unevenness due to difference between sizes in Y-direction of transistor.

Another object of this invention is to provide a method of designing a semiconductor integrated circuit apparatus which can eliminate dead space occurring between adjacent transistors when transistors are subjected to parallel arrangement.

A further object of this invention is to provide a method of designing a semiconductor integrated circuit apparatus which can realize desired arrangement in circuit design without dead space while carrying out parallel arrangement in correspondence with the restriction in height direction of respective rows without changing the arrangement relationship of transistors.

A method of designing a semiconductor integrated circuit apparatus according to this invention comprises: a placement step of generating row information indicating a transistor row in which transistors required for configuration of a transistor row to be designed so that wiring length is short as possible on the basis of net connection information of transistors, size information of various transistors constituting the net and ideal module size information which provides constraint relating to size in X-direction and size in Y-direction perpendicular to the X-direction of transistor row in which the various transistors are placed in X-direction; a row size determination step of generating, on the basis of the row information, row size information indicating sizes in X-direction and Y-direction of transistor row that the row information indicates; and a parallel arrangement step of carrying out parallel arrangement of transistors constituting the transistor row so that transistor row that the row information indicates falls within sizes in X-direction and Y-direction that the row size information indicates.

Moreover, the method of designing semiconductor integrated circuit apparatus according to this invention may includes, before the arrangement step or after row size determination step, a step of carrying out grouping of p·n pairs of transistors constituting a module to be designed in accordance with specific condition on the basis of ideal module size information.

Further, the placement step may be implementation of placement processing by so called mini-cut method of subdividing sets of p·n (p-channel/n-channel transistors) pairs so as to minimize the number of cuts to thereby determine placement of p·n pairs. In addition, not only the mini-cut method but also other placement algorithms conventionally used may be applied to such arrangement.

In accordance with this invention, since an approach is employed to determine optimum sizes in X-direction and Y-direction every transistor rows to carry out parallel arrangement with respect to transistors having transistor width greater than the sizes in X-direction and Y-direction, it is possible to realize automatic layout of transistors of different sizes without dead space.

As described above, in accordance with this invention, an approach is employed to determine optimum sizes in Y-direction of transistor rows every transistor rows to carry out parallel arrangement (division/folding) with respect to transistors having size in Y-direction greater than the determined size in Y-direction, thus making it possible to realize automatic layout of transistors of different sizes without dead space.

Namely, since this invention can eliminate dead space occurring resulting from unevenness due to difference between sizes in Y-direction of transistor row by parallel arrangement, and determines adjacent transistors so as to eliminate dead spaces occurring with respect to adjacent transistors when transistors are subjected to parallel arrangement, the steps of this invention are carried out (executed), thereby making it possible to securely realize layout having no dead space in transistors of different sizes. This greatly contributes to realization of automation.

BRIEF DESCRIPTION OF THE DRAWINGS

In the accompanying drawings:

FIG. 2 is a module model view showing outline of transistor module to be processed in this invention;

FIG. 6 is a model view showing concept of processing of parallel arrangement (division/folding) in the design procedure in accordance with the method shown in FIGS. 2–4;

FIG. 9 is an explanatory view showing concept of grouping of a p·n pair determination processing in the design procedure in accordance with the method shown in FIGS. 8 and 10;

FIG. 10 is a flowchart showing the content of computer processing for realizing a method of designing a semiconductor integrated circuit apparatus according to a third embodiment of this invention;

FIG. 11 is a table showing experimental examples of module widths and heights of respective rows in the case where no parallel arrangement is carried out, in the case of conventional parallel arrangement, and in the case of parallel arrangement by this invention; and FIG. 12 is a table showing areas of respective examples determined on the basis of respective total numeric values of FIG. 11.

DETAILED DESCRIPTION OF THE PREFERRED EMBODIMENTS

Figure 1A:
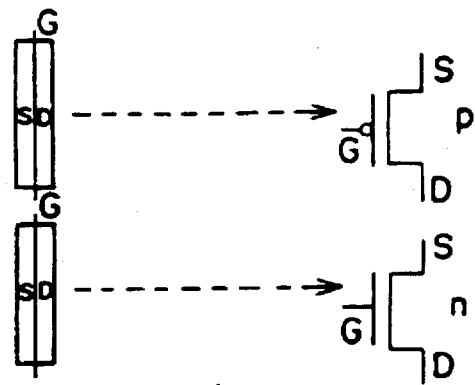
FIG. 1 is an explanatory view showing concept of conventional transistor pattern designing processing.
Figure 1B:
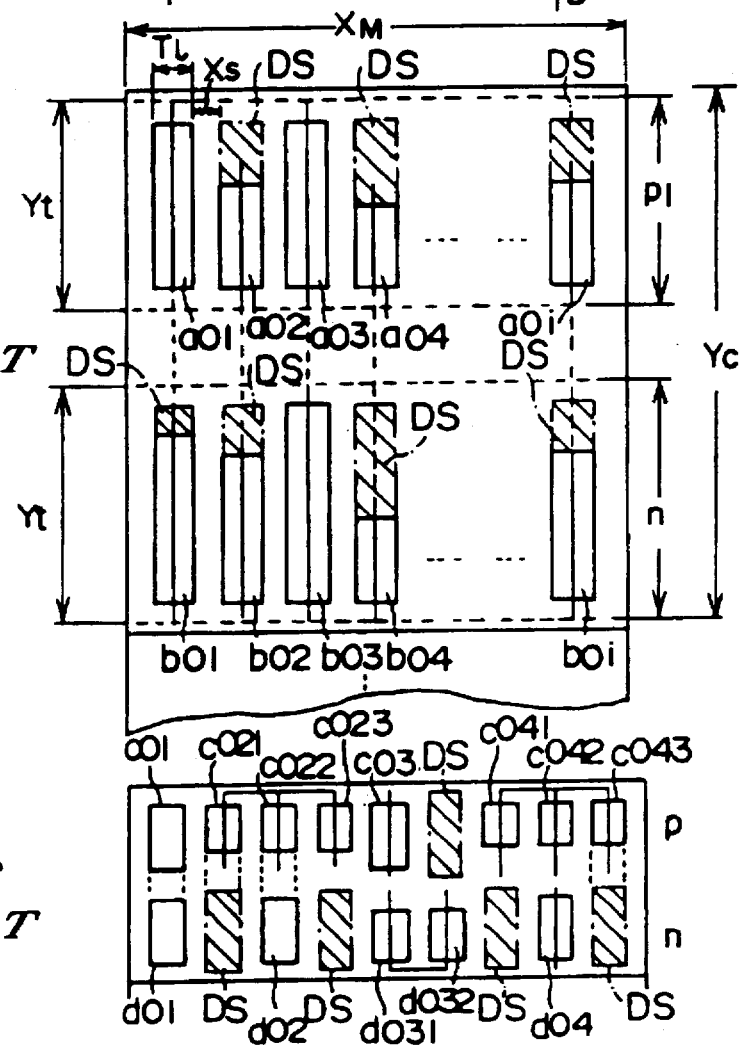
Figure 1C:
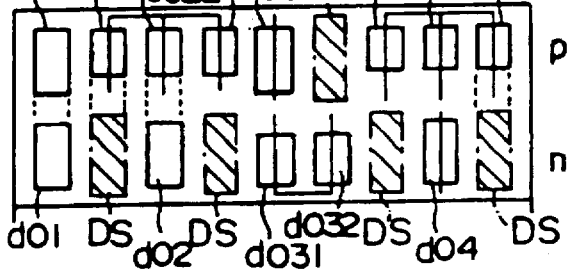

Preferred embodiments of a method of designing a semiconductor integrated circuit apparatus according to this invention will now be described in detail with reference to the attached drawings.

Prior to description of the embodiments of this invention, there will be first explained concept of transistor module to be designed and sizes of respective portions handled in the description of respective embodiments. FIG. 2 illustrates concept of sizes of respective portions handled in design of one module. In this figure, reference numeral 60 denotes a module, and reference numerals 61–63 denote transistor rows constituting the module 60. Transistor row 61 is composed of n1 number of transistor pairs 611–613, transistor row 62 is composed of n2 number of transistor pairs 621–622, and transistor row 63 is composed of n3 number of transistor pairs 631–632. $X_M$ is size in X-direction of module 60, Yc is size in Y-direction of transistor row, Xp is sizes in X-direction of transistor pairs 611–632, Tl is size in X-direction of transistor (i.e., transistor length), Tw is transistor width in the Y-direction, and Xs is a placement spacing between transistors (size in X-direction). Tl and Xs may be minimum size. Actually, although they are variable, such variables are fixed for the brevity of explanation. Namely, in FIG. 2, Xp which is sum of transistor length T$\lambda$ and required Xs is fixed in all transistor pairs.

Figure 3:
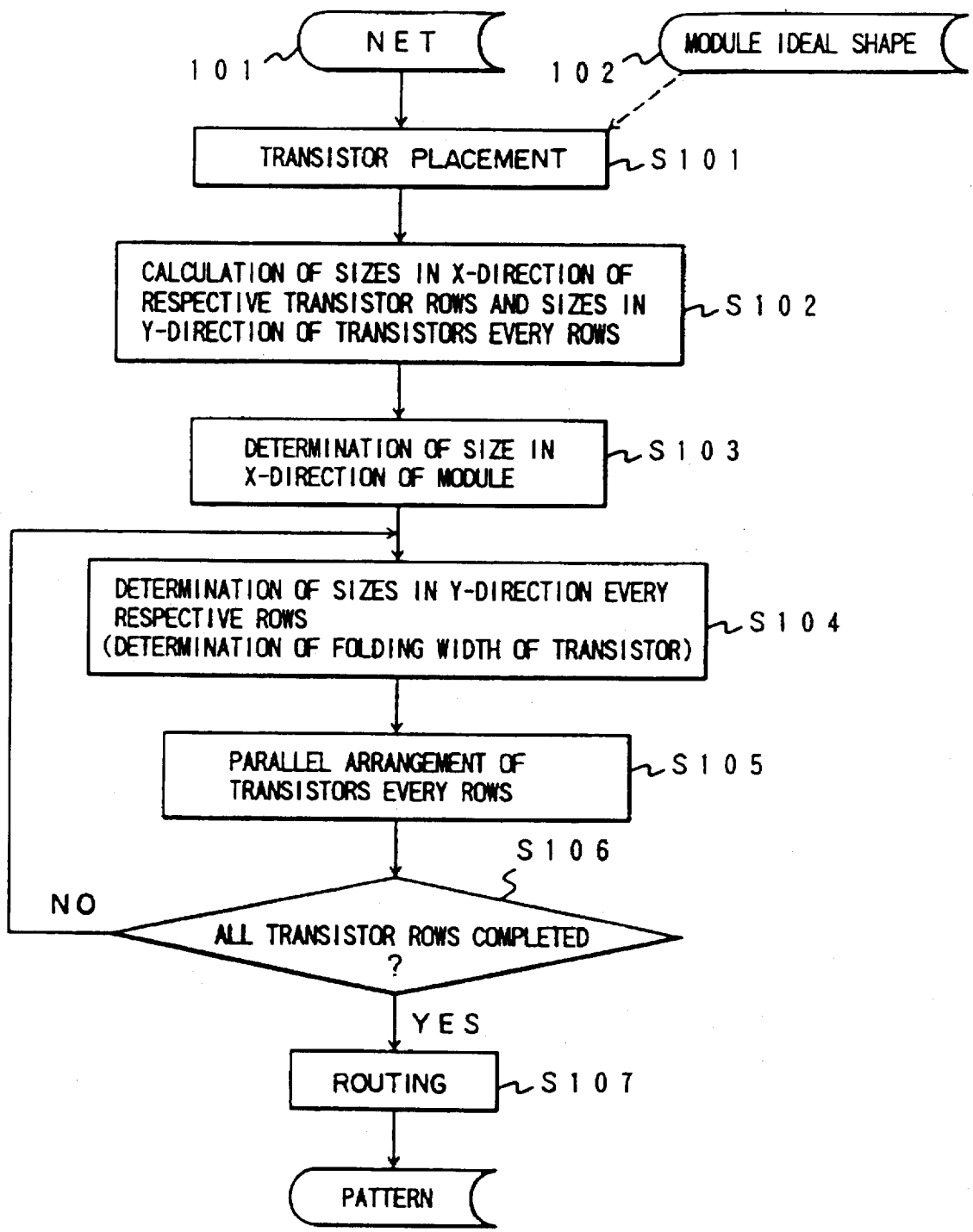
FIG. 3 is a flowchart showing the content of computer processing for realizing a method of designing a semiconductor integrated circuit apparatus according to a first embodiment of this invention.
Figure 4A:
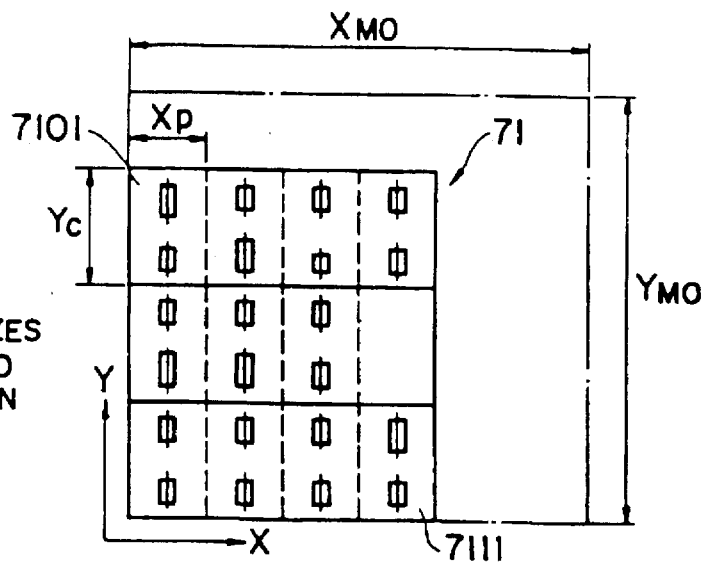
FIGS. 4A–4D are explanatory views showing design procedure in accordance with the method shown in the first embodiment of this invention.

FIG. 3 shows flow of the automatic designing method according to the first embodiment of this invention. Initially, at step S101, a location of transistors is determined relatively from net connection (description) data 101 and ideal shape data 102 of module. The net connection data 101 is composed of condition data such as description indicating connection between transistors, and sizes Tl in X-direction (transistor length) and sizes in Y-direction (transistor width) of respective transistors constituting respective transistor pairs 7101–7111. In the module ideal shape data 102, ratio (XMO/YMO) between sizes in X-direction and Y-direction or upper limit values of size in X-direction, and size in Y-direction of module 71 shown in FIG. 4A are included. At step S101, with respect to p-channel type transistors and n-channel type transistors, those transistors are respectively arranged in row form. As method of placement, there may be employed any technique of shortening wiring length in consideration of connecting relationship of net such as mini-cut method for subdividing sets of transistor pairs so as to minimize the number of cuts. Size $X_M$ in X-direction of respective rows may be directly obtained by module ideal shape data 102, or may be set so as not to exceed module ideal length $X_{MO}$ which is X-direction size of layout pattern which can be conjectured from module ideal shape data 102. Respective transistor are arranged by taking into consideration connection of nets.

Figure 4B:
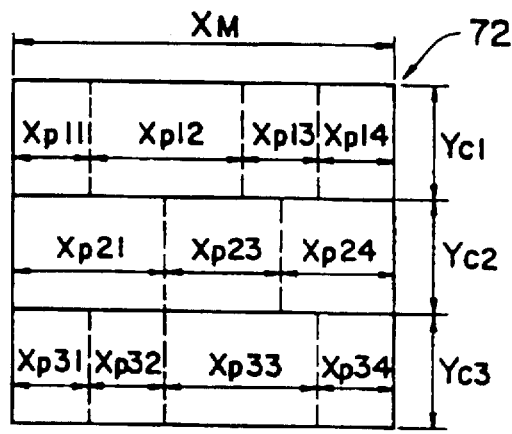
Figure 5A:
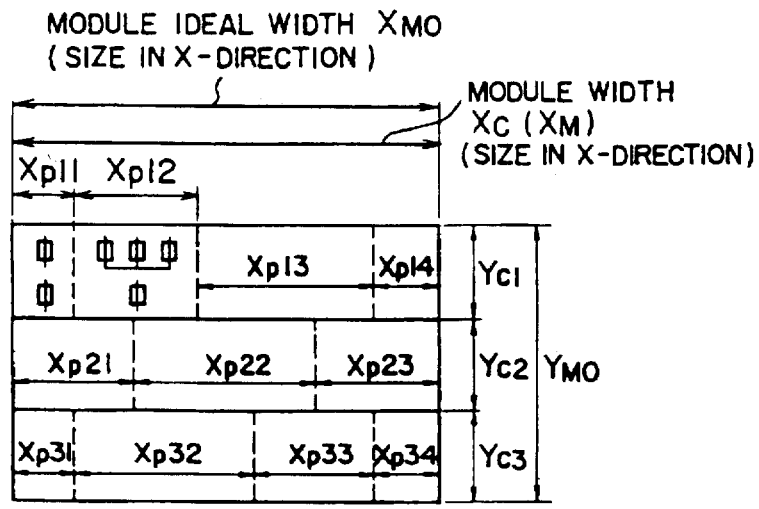
FIGS. 5A–5C are model views showing, in a conceptual manner, determination of module size in the design procedure in accordance with the method shown in this invention.
Figure 5B:
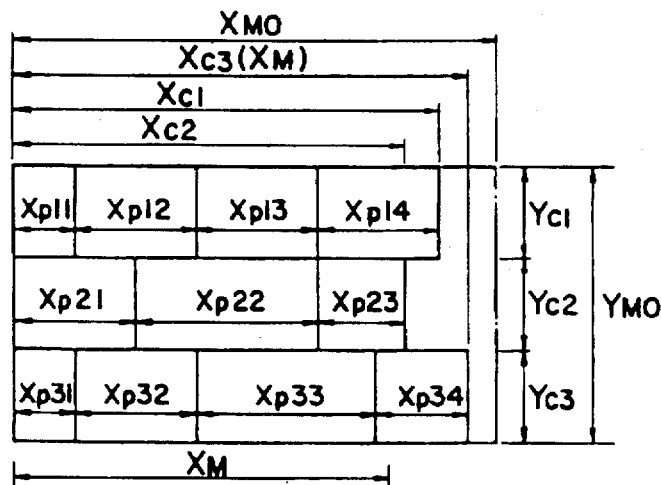
Figure 5C:
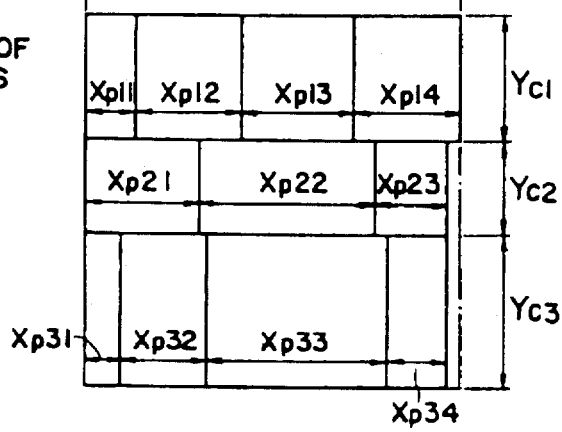

At step S102, sizes Yc1–Yc3 in Y-direction of transistor rows placed at step S101, and sizes Xc1–Xc3 (when ni is the number of transistors in the transistor row i, Xci=ni·Xp) in X-direction of transistors every respective transistor rows are calculated (FIG. 4A). Then, module X-direction size $X_M$ is determined from X-direction sizes Xc1–Xc3 of transistors every rows of transistor rows and ideal module shape (FIG. 4B). Thereafter, at step S104, since transistors having a size in Y-direction greater than the determined size Yc1 in Y-direction of the transistor row is caused to undergo parallel arrangement or folding, sizes in X-direction of respective transistors have a relationship as shown in FIG. 5A. As a result, sizes obtained by adding sizes Xp11–Xp14 or Xp21–Xp34 in X-direction of transistor pair become sizes in X-direction of respective rows. Moreover, Yc1–Yc3 are sizes in Y-direction of respective rows. At step S104, these sizes Xp11–Xp14 or Xp21–Xp23, or Xp31–Xp34, Yc1–Yc3 in X-direction and Y-direction are determined. The case shown in FIG. 5A is the case where sizes are determined so as to take a complete rectangle as module. Namely, FIG. 5A shows the ideal case where module ideal shape and layout shape are in correspondence with each other. It should be noted that such size determination processing in X-direction and Y-direction of module is not limited to the case where determination is made so that module becomes complete rectangle as the entirety. FIG. 5B shows the case where only size in X-direction is determined every transistor pair row. Such a technique is suitable in the case where there is margin in shape in X-direction, or the case where size in Y-direction is fixed. In addition, FIG. 5C shows the case where both sizes in X-direction and Y-direction are determined every transistor pair row. This is suitable in the case where there are margins in design shape with respect to both X-direction and Y-direction.

An example of a method of calculating transistor width Tw2 is taken. It is now assumed that size Tw1 in Y-direction of transistor is multiple of W, and size in X-direction of transistor pair is Xp. When sum total of sizes in Y-direction (transistor length) belonging to the respective transistor rows is assumed to be Ttw with respect to all transistor pair rows where size Xci in X-direction of arranged transistor pair row is less than the module width $X_{MO}$, and transistor row height (size in Y-direction) Ytci is assumed to be number 2n times greater W which is the closest to Ttw/($X_{MO}$/Xp). Here, a symbol "W" denotes a size a certain positive number times as large as the minimum value of a transistor width, which is allowed by a designing rule. Sum Xci' of sizes in X-direction of transistors when transistors of the transistor row where the size Tw1 in Y-direction thereof is above Tw2=Ytci/2 are folded is calculated. In the case where the sum Xci' is above module width $X_{MO}$, Tw2 is allowed to be greater by w. Such operation is repeated until size XC1' in X-direction of transistor row becomes maximum under the condition where it is less than size $X_{MO}$ in X-direction of module. Tw2 at this time becomes folding or dividing width of transistor. This is the example where respective folding widths of P-channel transistor and N-channel transistor are caused to be equal to each other, and ratio between folding widths may be changed.

Figure 4C:
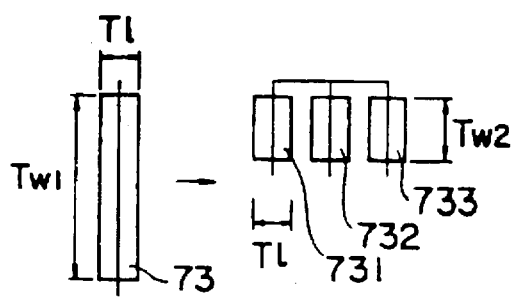
Figure 4D:
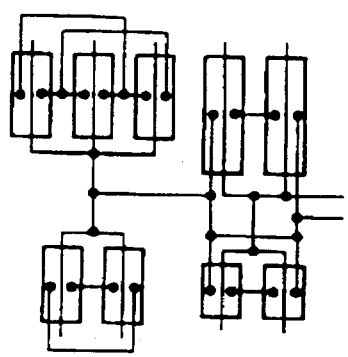

Then, at step S105, (Tw1/Tw2) ((Tw1/Tw2+1) in the case where size Tw in Y-direction of transistor is not divided by size Tw2 in Y-direction of transistor row) number of transistors having size Tw1 in Y-direction above size Tw2 in Y-direction of respective transistor rows are arranged. As shown in FIG. 4C, e.g., one transistor 73 is divided into three transistors 731 to 733 to connect them in parallel with their gates being common. FIG. 6 shows various forms of parallel arrangement, wherein FIG. 6(a) shows the state where parallel arrangement of transistors is not yet carried out (original state), and FIGS. 6(b)–6(d) show the state where parallel arrangement has been carried out. As shown in FIG. 6(a), in the case where size Tw1 in Y-direction of transistor is greater than ideal size Tw2 in Y-direction of transistor row, parallel arrangement thereof is carried out. In this case, either divisional parallel arrangement [FIGS. 6(b) and 6(c)] or folding parallel arrangement [FIG. 6(d)] can be selected. In the case of divisional parallel arrangement, division into arbitrary number of transistors may be carried out in such a manner that, in dependence upon size Tw1 in Y-direction, divisional parallel arrangement into three transistors of size Tw21 in Y-direction is carried out as shown in FIG. 6(b), and divisional parallel arrangement into two transistors of size Tw22 is carried out as shown in FIG. 6(c). Moreover, in the case of folding parallel arrangement, size Tw23 in Y-direction is determined in dependence upon size Tw2 in Y-direction to carry out parallel arrangement thereof. As seen from the above-described operation, since size $X_M$ in X-direction of transistor row can be adjusted by size Tw1 in Y-direction of transistor row, it is possible to carry out arrangement of transistors in the state where importance is attached to connection of nets to more degree rather than width of transistor row as compared to the prior art.

The above example applies to the case when a limitation in the X-direction size is severe. In the case where a row width after placement is within an ideal module size, if an X-direction size of the short row is determined in coincidence with a width of a row having the longest width so as to determine the size Tw2, it is possible to decrease unnecessary space in both of the X- and Y-directions.

In the case shown in FIG. 5B, namely, where widths of every rows are different from each other because there is a space in the X-direction, and where the limitation of the Y-direction size is sharply required, it is possible to previously determine the size Tw2 as the fixed value an n (a positive number more than one) times as large as W or transistor width of the minimum value. When the size Tw2 is determined to the minimum transistor width in the row, it is possible to limit the difference of the size in the X-direction less than the fixed value, and to set height of every rows to be a value having unnecessary space.

At step S106, judgment as to whether or not parallel arrangement with respect to all transistor rows is completed is made.

Figure 7A:
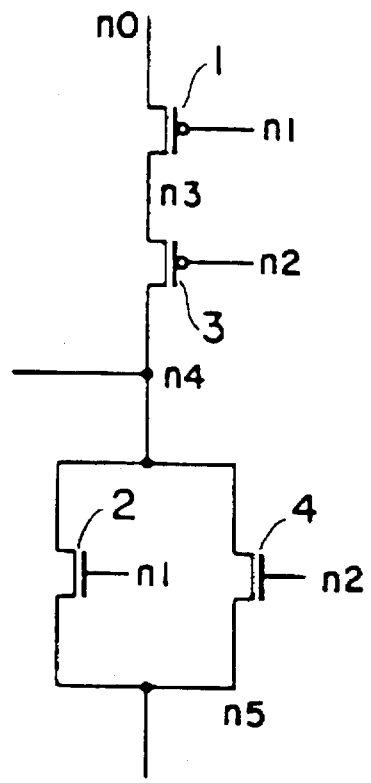
FIGS. 7A and 7B are explanatory views showing the relationship between circuit symbols and pattern symbols handled in this invention.
Figure 7B:
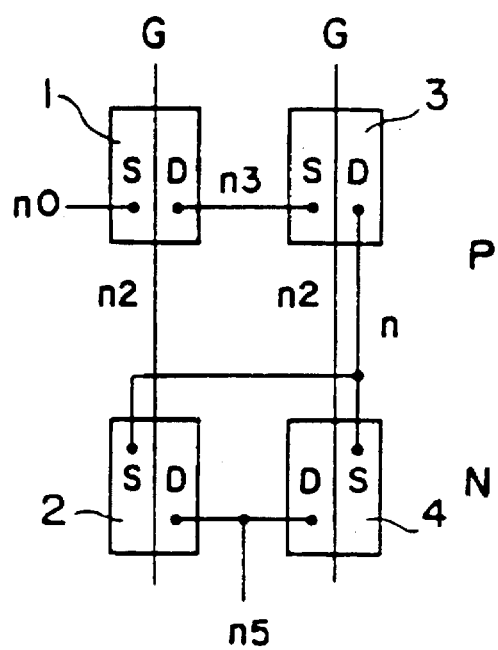

Then, at step S107, as shown in FIG. 7, routing is carried out by the conventional method. Thus, desired layout pattern can be obtained. FIG. 7 shows an example of routing together with an example of circuit. Here, with respect to the example of circuit comprised of four transistors 1–4 shown in FIG. 7(a), there is shown the example where routing is implemented as shown in FIG. 7(b). Transistors 1 and 3 are pMOS and transistors 2 and 4 are nMOS. In the case of forming such a circuit, adjacent transistors comprised of two sets of p·n pairs are used as shown in FIG. 7(b), and pattern design is made so that its routing is as simple as possible. As stated above, in accordance with the first embodiment, since an approach is employed to determine optimum sizes in X-direction and Y-direction every transistor rows to carry out parallel arrangement with respect to transistors having transistor length greater than the determined sizes in X-direction and Y-direction, automatic layout of transistors of different sizes can be realized without dead space.

Figure 8:
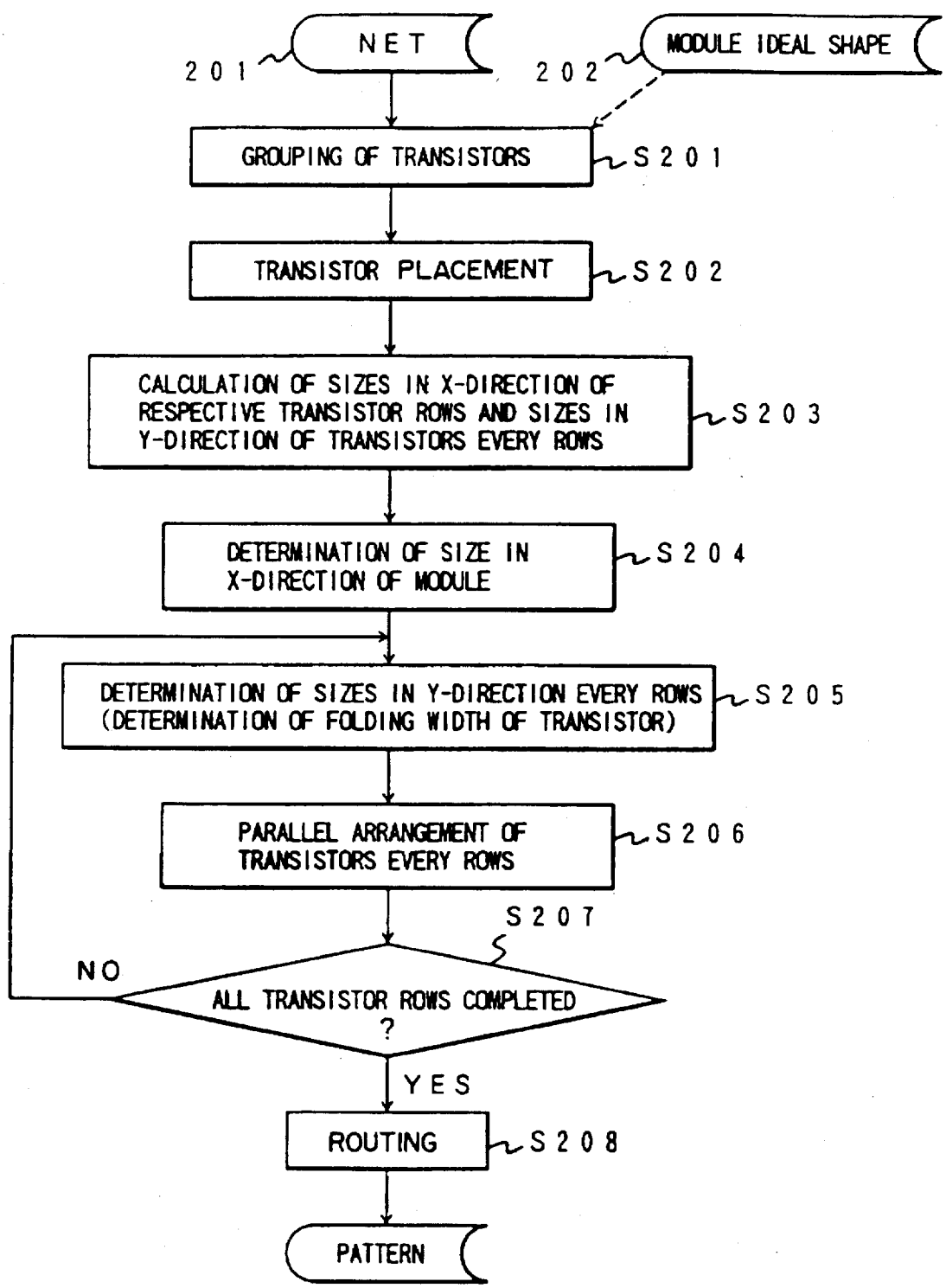
FIG. 8 is a flowchart showing the content of computer processing for realizing a method of designing a semiconductor integrated circuit apparatus according to a second embodiment of this invention.

FIG. 8 shows a method of designing a semiconductor integrated circuit apparatus according to the second embodiment of this invention. In the case where parallel arrangement of transistors is carried out, if sizes Twp, Twn in X-direction of p-channel transistor and n-channel transistor arranged as pair differ to much degree, any shift would take place in that position. As a result, there are instances where there results the ultimate arrangement relationship in which both transistors are arranged apart from each other. Moreover, when transistors of p·n pair are oppositely arranged as shown in FIG. 9(c) by taking into consideration capacity or skew in the case where gates are connected by polysilicon layer therebetween, dead spaces DS1–DS8 would take place. The second embodiment contemplates solving this problem. As shown in FIG. 9(d), transistor pairs are subjected to grouping so that there results no dead space even if magnitude of sizes in X-direction of p·n of transistor pair after divisional parallel arrangement or folding parallel arrangement of transistors is carried out to dispose such grouped transistor pairs in such a manner that they are adjacent to each other. As shown in FIG. 9(d), dead spaces DS1–DS8 are respectively effectively utilized, resulting in no useless (dead) space. As a method of grouping, transistor pairs in which sum of widths Tw of respective transistors of p·n pair are the same are first subjected to grouping. As this pair, from net information 201, sets of p·n pairs of transistors in which sums of sizes Tw in Y-direction of respective transistors of p·n pairs are substantially the same, i.e., set (set S1) of pairs in which size Twp in Y-direction of transistor of p-channel transistor is a1 and size Twn in Y-direction of n-channel transistor is b1 and set (set S2) of pair in which size Twp in Y-direction of p-channel transistor is a2 and size Twn in Y-direction of transistor of n-channel transistor is b2 are all extracted. Sets having higher degree of connection of nets are all extracted respectively from the sets S1 and the sets S2. FIGS. 9(a) and 9(b) show the states thereof in a conceptual manner. As shown in FIG. 9(a), in the case where transistors of various sizes are assumed to exist, as the result of pursuit of combinations in which sizes in Y-direction as the p·n pair are substantially the same, those transistor pairs are divided into respective groups of A, B, C and D. FIG. 9(b) shows the state where refined placement thereof is carried out. Respective sets having higher degree of connection of nets are combined from these sets S1 and S2 to group them.

Moreover, as another method of grouping, when reference width of p-channel transistor is Twp and reference width of n-channel transistor is Twn, sets S1 of p·n pairs of width Twp1 of p-channel transistor and width Twn1 of n-channel transistor expressed below, $$Twp^*(n1-1) < Twp1 \leq Twp^*n1$$

$$Twn^*(n2-1) < Twn1 \leq Twn^*n2$$

and sets S2 of p·n pairs of width Twp2 of p-channel transistor and width Twn2 of n-channel transistor expressed below:

$$Twp^*(n2-1) < Twp2 \leq Twp^*n2$$

$$Twn^*(n1-1) < Twn2 \leq Twn^*n1$$

are all extracted to combine respective sets having higher degree of connection from sets S1 and S2 to group them. Reference widths Twp, Twn of p·n transistors can be freely set along with mean size in Y-direction (transistor width) of respective p·n transistors, minimum sizes thereof, or mean value of predicted values of transistor row heights. At the transistor placement processing of the subsequent step S202, groups are adjacently placed. Processing at steps S203 to S208 will be carried out similarly to the first embodiment.

FIG. 10 shows a third embodiment of this invention. This embodiment is characterized in that, unlike the above-mentioned second embodiment, grouping of transistors is carried out after transistor placement processing and determination processing of various sizes are executed. Initially, up to the steps S301–S304, processing is carried out similarly to the first embodiment. In this connection, step S301 corresponds to step S101, step S302 corresponds to step S102, step S303 corresponds to step S103, and step S304 corresponds to step S104. At step S305, transistor pairs in which dead spaces are formed by difference between sizes of p-channel transistor and n-channel transistor are caused to undergo grouping from transistor row heights every respective transistor rows with empty area and degree of connection being as parameter. As an example thereof, when size in Y-direction of p-channel transistor row is Ycp and size in Y-direction of n-channel transistor row is Ycn, sets S1 of pairs in which size Twp1 in Y-direction (transistor width) of p-channel transistor and size Twn1 in Y-direction (transistor width) of n-channel transistor are expressed below:

$$Ycp*(n1-1)<Twp1\leq Ycp*n1$$

$$Ycn*(n2-1)<Twn1\leq Ycn*n2$$

and sets S2 of pairs in which size Twp2 in Y-direction (transistor width) and size Twn2 in Y-direction (transistor width) of n-channel transistor are expressed below:

$$Ycp*(n2-1)<Twp2\leq Ycp*n2$$

$$Ycn*(n1-1)<Twn2\leq Ycb*n1$$

are extracted from all transistors belonging to the transistor row to combine respective sets having higher degree of connection of nets from the sets S1 and S2 to group them. As another method, when size in Y-direction of p-channel transistor is Ycp and size in Y-direction of n-channel transistor is Ycn, with respect to n1, n2, n3, n4 having the relationship described below:

$$n1+n4=n2+n3$$

sets S1 of pairs in which size Twp1 in Y-direction of p-channel transistor and size Twn1 in Y-direction of n-channel transistor are expressed below, $$Ycp*(n1-1)<Twp2\leq Ycp*n1$$

$$Ycn*(n2-1)<Twn1\leq Ycn*n2$$

sets S2 in which size Twp2 in Y-direction (transistor width) of p-channel transistor and size twn2 in Y-direction of n-channel transistor are expressed below.

$$Ycp*(n3-1)<Twp2\leq Ycp*n3$$

$$Ycn*(n4-1)<Twn2\leq Ycp*n4$$

are extracted from all transistors belonging to the transistor row. Then, respective sets of pairs having higher degree of connection of nets are combined from the sets S1, S2 to allow combined transistor pairs to be groups. Further, at step S306, replacement of transistors is carried out so that transistor pairs belonging to respective groups are adjacently arranged. In connection with this, step S307 corresponds to step S105, step S308 corresponds to step S106, and step S309 corresponds to step S107.

FIGS. 11 and 12 are tables showing the effects of apparatus designed by the method of designing semiconductor integrated circuit apparatus according to this invention in a comparative manner with respect to ordinary module in which no parallel arrangement is carried out, the conventional parallel arrangement and parallel arrangement module according to this invention. As is clear from FIG. 11, in the parallel arrangement processing according to this invention, the maximum value of module width is increased by about 42% as compared to the case where no parallel arrangement is carried out, and is increased by about 34% as compared to the conventional parallel arrangement, but total value of row heights is reduced to about 1/6 as compared to the case where no parallel arrangement is carried out, and is reduced to about 5/8 as compared to the conventional parallel arrangement.

For this reason, as shown in FIG. 12, areas of respective types (A), (B), (C) of the parallel arrangement module according to this invention can be advantageously reduced to about 2/3 as compared to the case where no parallel arrangement is carried out, and to about 4/5 as the conventional one.

What is claimed is:

1. A method of designing a semiconductor integrated circuit apparatus comprising:

a placement step of generating row information indicating a transistor row in which transistors required for the configuration of a transistor row to be designed so that wiring length is as short as possible, on the basis of net description information of transistors, size information of various transistors constituting net, and ideal module size information which provides constraint relating to size in the X-direction and in Y-direction perpendicular to the X-direction of the transistor row in which the various transistors are placed in the X-direction;

a row size determination step of generating row size information indicating sizes in the X-direction and Y-direction of the transistor rows;

each row size determination step of generating, on the basis of the row sizes information, row size indicating size in the X-direction and sizes in the Y-direction of the transistor rows that the rows information indicates; and a parallel arrangement step of carrying out parallel arrangement of transistors constituting the transistor row so that the transistor row that the row information indicates falls within sizes in the X-direction and Y-direction that the row size information indicates.

2. A method of designing a semiconductor integrated circuit apparatus as set forth in claim 1, wherein
   the method includes, before the placement step or after the row size determination step, a step of carrying out grouping of p-n pair of transistors constituting a module to be designed in accordance with a specific condition on the basis of ideal module size information.

3. A method of designing a semiconductor integrated circuit apparatus as set forth in claim 1, wherein
   in said placement step of generating said row information, an arrangement is performed with a width smaller than an X-direction size of a module size.

4. A method of designing a semiconductor integrated circuit apparatus as set forth in claim 3, wherein
   the method further includes a row size determination step of determining sizes in Y-direction with respect to entire transistor rows in the manner of matching a size in X-direction of an ideal module.

5. A method of designing a semiconductor integrated circuit apparatus as set forth in claim 3, wherein
   the method further includes a row size determination step of determining sizes in Y-direction with respect to entire transistor rows in the manner of matching a size in X-direction of an ideal module, when the longest transistor row coincides with a size in X-direction of an ideal module size.

6. A method of designing a semiconductor integrated circuit apparatus as set forth in claim 1, wherein
   in said placement step of generating said row information, a placement is performed by attaching importance to a connection of nets.

7. A method of designing a semiconductor integrated circuit apparatus as set forth in claim 1, wherein
   the method further includes a row size determination step of determining, when a size in Y-direction of an ideal module size is defined, a predetermined size or total size of respective transistor row in Y-direction in the manner of coinciding with a size of an ideal module size.

8. A semiconductor integrated circuit apparatus designed by the designing method according to claim 1;
   said apparatus is designed in the manner that all the transistor is stored within a scope of a module width which is determined without breaking a placement relationship determined in said placement step.

* * * * *